US009667900B2

(12) United States Patent
Oganesian et al.

(10) Patent No.: US 9,667,900 B2
(45) Date of Patent: May 30, 2017

(54) THREE DIMENSIONAL SYSTEM-ON-CHIP IMAGE SENSOR PACKAGE

(71) Applicant: Optiz, Inc., Palo Alto, CA (US)

(72) Inventors: Vage Oganesian, Sunnyvale, CA (US); Zhenhua Lu, East Palo Alto, CA (US)

(73) Assignee: Optiz, Inc., Palo Alto, CA (US)

( * ) Notice: Subject to any disclaimer, the term of this patent is extended or adjusted under 35 U.S.C. 154(b) by 0 days.

(21) Appl. No.: 14/554,601

(22) Filed: Nov. 26, 2014

(65) Prior Publication Data
US 2015/0163425 A1 Jun. 11, 2015

Related U.S. Application Data

(60) Provisional application No. 61/913,627, filed on Dec. 9, 2013.

(51) Int. Cl.
*H04N 5/369* (2011.01)
*H01L 27/146* (2006.01)
*H04N 5/374* (2011.01)
*H04N 5/378* (2011.01)
*H04N 5/225* (2006.01)
(Continued)

(52) U.S. Cl.
CPC ........... *H04N 5/378* (2013.01); *H04N 5/2254* (2013.01); *H04N 5/374* (2013.01); *H04N 5/3745* (2013.01); *H04N 5/37455* (2013.01); *G02B 13/0015* (2013.01); *H01L 2224/48091* (2013.01); *H01L 2224/73265* (2013.01)

(58) Field of Classification Search
CPC ...... H04N 5/369; H04N 5/2254; H04N 5/378; H04N 5/3745; H04N 5/37455; H01L 27/146; H01L 27/14612; H01L 27/14641; H01L 27/14685
See application file for complete search history.

(56) References Cited

U.S. PATENT DOCUMENTS

| 6,521,881 | B2 | 2/2003 | Tu et al. |
| 6,777,767 | B2 | 8/2004 | Badehi |
| 6,894,358 | B2 | 5/2005 | Leib et al. |

(Continued)

FOREIGN PATENT DOCUMENTS

| EP | 1686789 | 8/2006 |
| JP | 2001-339057 | 12/2001 |

(Continued)

OTHER PUBLICATIONS

U.S. Appl. No. 13/157,193, filed Jun. 2011, Oganesian.
(Continued)

*Primary Examiner* — Abdelaaziz Tissire
(74) *Attorney, Agent, or Firm* — DLA Piper LLP (US)

(57) ABSTRACT

An image sensor that comprises a first substrate and a plurality of photo detector assemblies disposed on or in the first substrate. Each of the photo detector assemblies comprises a photo detector formed on or in a second substrate and configured to generate an analog signal in response to received light, a converter formed on or in a third substrate, wherein the converter is electrically coupled to the photo detector and includes circuitry for converting the analog signal to a digital signal, a processor formed on or in a fourth substrate, wherein the processor is electrically coupled to the converter and includes circuitry for processing the digital signal.

7 Claims, 11 Drawing Sheets

(51) Int. Cl.
  *H04N 5/3745* (2011.01)
  *G02B 13/00* (2006.01)

(56) References Cited

U.S. PATENT DOCUMENTS

| | | | |
|---|---|---|---|
| 6,972,480 | B2 | 12/2005 | Zilber et al. |
| 7,033,664 | B2 | 4/2006 | Zilber et al. |
| 7,071,521 | B2 | 7/2006 | Leib et al. |
| 7,157,742 | B2 | 1/2007 | Badehi |
| 7,192,796 | B2 | 3/2007 | Zilber et al. |
| 7,265,440 | B2 | 9/2007 | Zilber et al. |
| 7,268,410 | B1 | 9/2007 | Hopper et al. |
| 7,285,834 | B2 | 10/2007 | Leib et al. |
| 7,364,933 | B2 | 4/2008 | Kim |
| 7,495,341 | B2 | 2/2009 | Zilber et al. |
| 7,642,629 | B2 | 1/2010 | Zilber et al. |
| 7,781,781 | B2 | 8/2010 | Adkisson et al. |
| 7,791,199 | B2 | 9/2010 | Grinman et al. |
| 7,875,948 | B2 | 1/2011 | Hynecek et al. |
| 7,901,989 | B2 | 3/2011 | Haba et al. |
| 7,919,348 | B2 | 4/2011 | Akram et al. |
| 7,935,568 | B2 | 5/2011 | Oganesian |
| 7,936,062 | B2 | 5/2011 | Humpston et al. |
| 7,973,397 | B2 | 7/2011 | Hsu et al. |
| 8,115,267 | B2 | 2/2012 | Miura |
| 8,310,036 | B2 | 11/2012 | Haba et al. |
| 8,314,482 | B2 | 11/2012 | Chen et al. |
| 8,405,196 | B2 | 3/2013 | Haba et al. |
| 8,546,900 | B2 | 10/2013 | Oganesian |
| 8,552,518 | B2 | 10/2013 | Oganesian |
| 8,604,576 | B2 | 12/2013 | Oganesian |
| 2004/0251525 | A1 | 12/2004 | Zilber |
| 2005/0029643 | A1* | 2/2005 | Koyanagi ............ G02B 3/0056 257/680 |
| 2005/0052751 | A1* | 3/2005 | Liu ..................... G02B 3/0012 359/626 |
| 2005/0104179 | A1 | 5/2005 | Zilber |
| 2005/0133916 | A1* | 6/2005 | Karnezos ........... H01L 23/4334 257/738 |
| 2005/0205977 | A1 | 9/2005 | Zilber |
| 2006/0022290 | A1* | 2/2006 | Chen ..................... H01L 24/82 257/432 |
| 2006/0222300 | A1 | 10/2006 | Frenzel et al. |
| 2007/0031137 | A1 | 2/2007 | Bogdan et al. |
| 2007/0138498 | A1 | 6/2007 | Zilber |
| 2007/0158787 | A1 | 7/2007 | Chanchani |
| 2007/0190691 | A1 | 8/2007 | Humpston |
| 2007/0190747 | A1 | 8/2007 | Humpston |
| 2008/0012115 | A1 | 1/2008 | Zilber |
| 2008/0017879 | A1 | 1/2008 | Zilber |
| 2008/0073734 | A1 | 3/2008 | Kong |
| 2008/0083939 | A1* | 4/2008 | Guidash ........... H01L 27/14634 257/292 |
| 2008/0083976 | A1 | 4/2008 | Haba |
| 2008/0083977 | A1 | 4/2008 | Haba |
| 2008/0093695 | A1* | 4/2008 | Gao ................. H01L 27/14636 257/428 |
| 2008/0099864 | A1 | 5/2008 | Wu et al. |
| 2008/0099900 | A1 | 5/2008 | Oganesian |
| 2008/0099907 | A1 | 5/2008 | Oganesian |
| 2008/0116544 | A1 | 5/2008 | Grinman |
| 2008/0116545 | A1 | 5/2008 | Grinman |
| 2008/0129839 | A1* | 6/2008 | Asukai ................ H04N 5/2251 348/231.99 |
| 2008/0150121 | A1 | 6/2008 | Oganesian |
| 2008/0156518 | A1 | 7/2008 | Honer et al. |
| 2008/0157250 | A1 | 7/2008 | Yang et al. |
| 2008/0191297 | A1 | 8/2008 | Yang et al. |
| 2008/0191300 | A1 | 8/2008 | Nystrom et al. |
| 2008/0191312 | A1* | 8/2008 | Oh ..................... H01L 21/2007 257/532 |
| 2008/0197435 | A1 | 8/2008 | Yang et al. |
| 2008/0237762 | A1 | 10/2008 | Swain et al. |
| 2008/0246136 | A1 | 10/2008 | Haba et al. |
| 2008/0265350 | A1 | 10/2008 | Wu et al. |
| 2009/0014822 | A1 | 1/2009 | Poo et al. |
| 2009/0023243 | A1* | 1/2009 | Koyanagi ............ H01L 21/568 438/107 |
| 2009/0070727 | A1* | 3/2009 | Solomon .............. G06F 17/5045 716/128 |
| 2009/0085134 | A1 | 4/2009 | Park et al. |
| 2009/0115042 | A1* | 5/2009 | Koyanagi ............ H01L 21/561 257/686 |
| 2009/0115047 | A1 | 5/2009 | Haba |
| 2009/0146148 | A1 | 6/2009 | Pyo |
| 2009/0146312 | A1* | 6/2009 | Sulfridge .......... H01L 21/76898 257/774 |
| 2009/0152658 | A1 | 6/2009 | Bolken et al. |
| 2009/0160065 | A1 | 6/2009 | Haba |
| 2009/0212381 | A1 | 8/2009 | Crisp |
| 2009/0224364 | A1* | 9/2009 | Oh ...................... H01L 21/2007 257/532 |
| 2009/0253226 | A1 | 10/2009 | Kong |
| 2010/0001305 | A1 | 1/2010 | Lin et al. |
| 2010/0053407 | A1 | 3/2010 | Crisp |
| 2010/0078770 | A1* | 4/2010 | Purushothaman .. H01L 21/6835 257/621 |
| 2010/0159621 | A1 | 6/2010 | Kimura et al. |
| 2010/0167447 | A1 | 7/2010 | Kim |
| 2010/0181636 | A1 | 7/2010 | Takayama et al. |
| 2010/0200898 | A1* | 8/2010 | Lin ................... H01L 27/14618 257/294 |
| 2010/0225006 | A1 | 9/2010 | Haba |
| 2010/0230812 | A1 | 9/2010 | Oganesian |
| 2010/0238331 | A1* | 9/2010 | Umebayashi ..... H01L 27/14632 348/294 |
| 2010/0258712 | A1 | 10/2010 | Wiese et al. |
| 2011/0012259 | A1 | 1/2011 | Grinman |
| 2011/0031629 | A1 | 2/2011 | Haba |
| 2011/0033979 | A1 | 2/2011 | Haba |
| 2011/0042770 | A1 | 2/2011 | Brady |
| 2011/0044367 | A1 | 2/2011 | Budd et al. |
| 2011/0044369 | A1 | 2/2011 | Andry et al. |
| 2011/0049696 | A1 | 3/2011 | Haba |
| 2011/0147871 | A1 | 6/2011 | Utsumi et al. |
| 2011/0187007 | A1 | 8/2011 | Haba |
| 2011/0249113 | A1* | 10/2011 | Koyanagi ............ H01L 21/568 348/95 |
| 2011/0317371 | A1 | 12/2011 | Liu |
| 2012/0018863 | A1 | 1/2012 | Oganesian |
| 2012/0018868 | A1 | 1/2012 | Oganesian |
| 2012/0018893 | A1 | 1/2012 | Oganesian |
| 2012/0018894 | A1 | 1/2012 | Oganesian |
| 2012/0018895 | A1 | 1/2012 | Oganesian |
| 2012/0019969 | A1* | 1/2012 | Iwabuchi ................ H03M 1/08 361/56 |
| 2012/0020026 | A1 | 1/2012 | Oganesian |
| 2012/0068327 | A1 | 3/2012 | Oganesian |
| 2012/0068330 | A1 | 3/2012 | Oganesian |
| 2012/0068351 | A1 | 3/2012 | Oganesian |
| 2012/0068352 | A1 | 3/2012 | Oganesian |
| 2012/0105263 | A1* | 5/2012 | Strachan ............... H03M 1/368 341/155 |
| 2012/0168882 | A1* | 7/2012 | Cherian ........... G01N 33/48785 257/414 |
| 2012/0313207 | A1 | 12/2012 | Oganesian |
| 2013/0020665 | A1 | 1/2013 | Oganesian |
| 2013/0045569 | A1* | 2/2013 | Koyanagi ............ H01L 21/568 438/107 |
| 2013/0056844 | A1 | 3/2013 | Oganesian |
| 2013/0127000 | A1 | 5/2013 | Oganesian |
| 2013/0221473 | A1* | 8/2013 | Shimotsusa ........... H01L 31/024 257/443 |
| 2013/0242155 | A1* | 9/2013 | Oganesian ............ H04N 5/374 348/308 |
| 2013/0249031 | A1 | 9/2013 | Oganesian |
| 2014/0004646 | A1 | 1/2014 | Oganesian |

FOREIGN PATENT DOCUMENTS

| | | |
|---|---|---|
| JP | 2001339057 A * | 12/2001 |
| KR | 10-2007-0046192 | 5/2007 |

(56) References Cited

FOREIGN PATENT DOCUMENTS

| TW | 200300291 | 5/2003 |
|---|---|---|
| TW | 200606048 | 2/2006 |
| TW | 201125111 | 7/2006 |
| TW | 201344889 | 11/2013 |

OTHER PUBLICATIONS

U.S. Appl. No. 13/157,202, filed Jun. 2011, Oganesian.
U.S. Appl. No. 13/157,207, filed Jun. 2011, Oganesian.
U.S. Appl. No. 13/225,092, filed Sep. 2011, Oganesian.
U.S. Appl. No. 13/301,683, filed Nov. 2011, Oganesian.
U.S. Appl. No. 13/312,826, filed Dec. 2011, Oganesian.
U.S. Appl. No. 13/343,682, filed Jan. 2012, Oganesian.
U.S. Appl. No. 13/356,328, filed Jan. 2012, Oganesian.
U.S. Appl. No. 13/423,045, filed Mar. 2012, Oganesian.
U.S. Appl. No. 13/427,604, filed Mar. 2012, Oganesian.
U.S. Appl. No. 13/468,632, filed May 2012, Oganesian.
U.S. Appl. No. 13/559,510, filed Jul. 2012, Oganesian.
U.S. Appl. No. 13/609,002, filed Sep. 2012, Oganesian.
Kurino, et al., "Intelligent Image Sensor Chip With Three Dimensional Structure," Electron Devices Meeting, IEDM 99-879, Technical Digest IEEE 1999, pp. 879-882.

* cited by examiner

THREE DIMENSIONAL SYSTEM-ON-CHIP IMAGE SENSOR PACKAGE

RELATED APPLICATIONS

This application claims the benefit of U.S. Provisional Application No. 61/913,627, filed Dec. 9, 2013, and which is incorporated herein by reference.

FIELD OF THE INVENTION

The present invention relates to packaged image sensors.

BACKGROUND OF THE INVENTION

It is presently known to package a processor with an image sensor device in a stacked System-In-Package (SIP) configuration. See for example U.S. Pat. No. 6,521,881, which is incorporated herein by reference. In such a configuration, the processor is specifically designed to process signals produced by the image sensor die. The image sensor die is connected to the processor via wirebonding and an interposer. One drawback with this configuration is that the sensor output signals have a relatively long travel path (i.e. through wirebonding, through interposer, and through more wirebonding), which reduces efficiency and limits the capability of the image sensor system. The sensor die has basic pre-processing functions, such as converting analog signals to digital signals. However, the sensor die does not have any post processing capability. Also, this configuration consumes an excessive amount of space, both vertically and horizontally.

One conventional solution is to form the processor and the image sensor in a 2D System-On-Chip (SOC) configuration. See for example European Patent 1686789. In this configuration, the processor is formed on the same die as the image sensor. This design improves (reduces) the signal travel distance compared to the SIP configuration, but the travel distance is still relatively long. Also, by using a SOC configuration, the processer area can be significantly limited, thus limiting the number of available transistors forming the processor (and therefore limiting its processing capabilities and performance). In some cases, only the basic image sensor control logic is integrated on the same die as the sensor.

Another conventional solution is 2.5D/3D packaging techniques, which involve mounting separately fabricated and completed semiconductor modules/wafers on top of one another. This solution reduces overall size (somewhat), and can reduce travel signal distance (somewhat). However, this solution still requires careful integration of separately fabricated components, and only reduces size and travel signal distance only to a certain extent.

Many conventional mobile devices rely on the mobile device's main processor (i.e. the application processor) to process image sensor signals. The steps of image capturing and signal processing include the CMOS image sensor capturing light information and generating analog signals, converting the analog information to raw digital data, and transferring the raw digital data to the application processor. The application processor uses image processing software to turn the raw digital data into a digital image. This process flow relies on the application processor for digital image processing. However, digital image processing requires a lot of processing power and computation capability from the processor, and many advanced computational algorithms are not well suitable for the mobile phone platform due to such constraints. While the application processor can have great flexibility, the tradeoff however is application specific processing, meaning the processor can process the data but not in a fast and efficient manner. The application processor is also relatively far from the image sensor, so any feedback or adjustments to the sensor device are greatly delayed. The application processor needs to manage not only the image sensor, but the whole mobile device while processing the raw image data. Raw image data is very large in size, and transferring such files costs substantial resources and huge delays.

Some mobile devices use a 3D-SOC chip, which is separate from the application processor chip, to process image data. The image capturing process, performed by the 3D-SOC chip, includes capturing light information and generating analog signals, converting analog information to raw digital data, processing the raw digital data and converting it into digital images with the help of hardware acceleration, and transferring the processed digital image to the application processor. This process flow enables advanced computational algorithms that are not well suited for the mobile phone platform. The 3D-SOC processor is application specific to digital image processing. The hardware acceleration allows the raw data to be processed in a fast and efficient manner. The 3D-SOC chip has an integrated processor that can be less than 2 µm under the image sensor, such that signal latency is greatly reduced. The configuration enables speedy and advanced camera system self-correction mechanism based on the raw digital data, and produces the best possible set of raw digital data for digital image processing. The application processor is freed to manage other tasks, improving overall mobile device performance. Processed image data is very small in size, so transferring such file data in the current mobile device is negligible on the system task load. Therefore, an improved 3D-SOC camera chip which is smaller, more reliably fabricated, and provides shorter signal travel distances, is needed.

BRIEF SUMMARY OF THE INVENTION

The aforementioned problems and needs are addressed by an image sensor that comprises a first substrate and a plurality of photo detector assemblies disposed on or in the first substrate. Each of the photo detector assemblies comprises a photo detector formed on or in a second substrate and configured to generate an analog signal in response to received light, a converter formed on or in a third substrate, wherein the converter is electrically coupled to the photo detector and includes circuitry for converting the analog signal to a digital signal, a processor formed on or in a fourth substrate, wherein the processor is electrically coupled to the converter and includes circuitry for processing the digital signal.

A method of forming an image sensor comprises providing a first substrate and forming each of a plurality of photo detector assemblies disposed on or in the first substrate by forming a photo detector on or in a second substrate, wherein the photo detector is configured to generate an analog signal in response to received light, forming a converter on or in a third substrate, forming a processor on or in a fourth substrate, electrically coupling the converter to the photo detector, wherein the converter includes circuitry for converting the analog signal to a digital signal, and electrically coupling the processor to the converter, wherein the processor includes circuitry for processing the digital signal.

Other objects and features of the present invention will become apparent by a review of the specification, claims and appended figures.

DETAILED DESCRIPTION OF THE INVENTION

Figure 1:
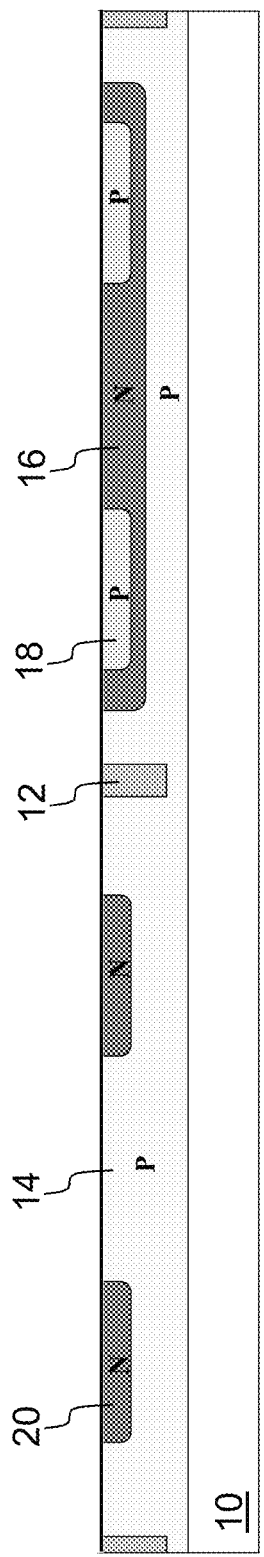
FIGS. 1-9 are side cross sectional views showing the steps in fabricating the photo detector assembly of the present invention.

The present invention is a 3D-SOC integration of a photonic sensor and processor. FIGS. 1-9 are side cross sectional views showing the fabrication of the three dimensional system-on-chip photo detector assemblies (as many as one per pixel). The fabrication process begins by forming a processor 8, which starts with providing a silicon substrate 10 preferably having a thickness in the range from 100 µm to 700 µm. Impurities are implanted into the silicon substrate top surface. The implantation can be performed using silicon doping processes such as diffusing doping, ion implantation and any other well-known doping processes. Additional impurities are selectively implanted into the already doped silicon to form processor circuit elements and patterns, such as isolation regions 12, well regions (e.g. P doped substrate or P wells 14, N wells 16, etc.), doped regions (e.g. P doped regions 18, N doped regions 20), P-N junctions, and other semiconductor patterns that are well known in the art for forming processors. While at least one layer of doping is used, doping can be repeated many times at various depths and areas, creating layers of doped silicon. Well known silicon doping processes such as diffusing doping, ion implantation and any other well know processes can be used. The doping pattern is shown in FIG. 1 and is exemplary only as a generic representation of a processor semiconductor device.

Figure 2:
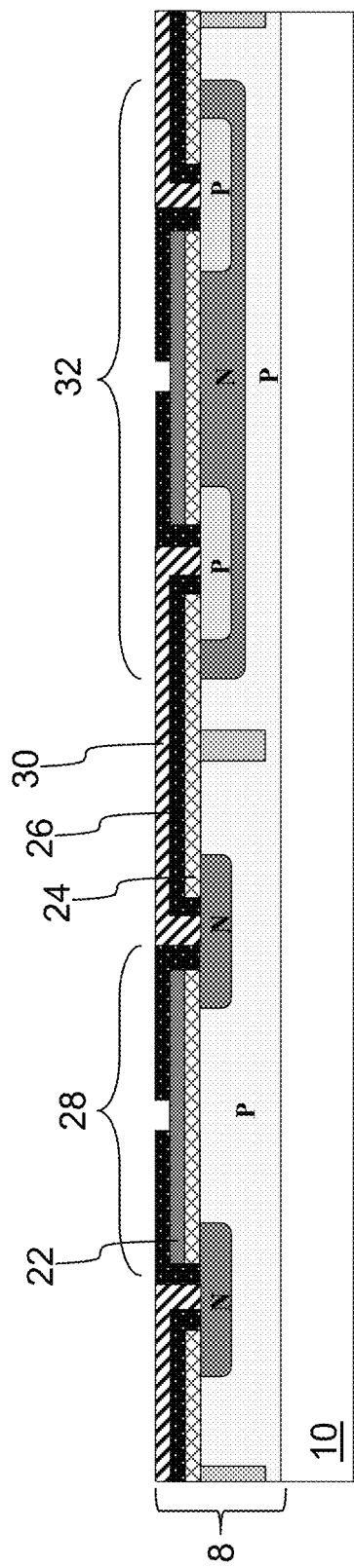

The fabrication of the processor 8 is completed by using well known complementary metal-oxide-semiconductor (CMOS) fabrication processes. Semiconductor structures, metallic layers and dielectric layers are formed over the silicon substrate 10 resulting in polysilicon layers 22, oxide layers 24, diffusion barriers 26, gate structures 28, conductive traces 30, transistor structures 32, memory cell cache, analog to digital converters (ADC), busses, and any other components that are well known to be included in a processor unit and not further described herein. The processor's main task is to handle image processing related tasks, such as color correction, auto focus, pixel interpolation, image sharping and any other appropriate image processing related tasks. The structure shown in FIG. 2 is exemplary only, and intended as a generic representation of processor formation and structure. Any other appropriate semiconductor structures such as ti-gate, vertical transistor, stacked transistors, etc. can be used and their formation processes are well known in the art and not further described herein.

Figure 3:
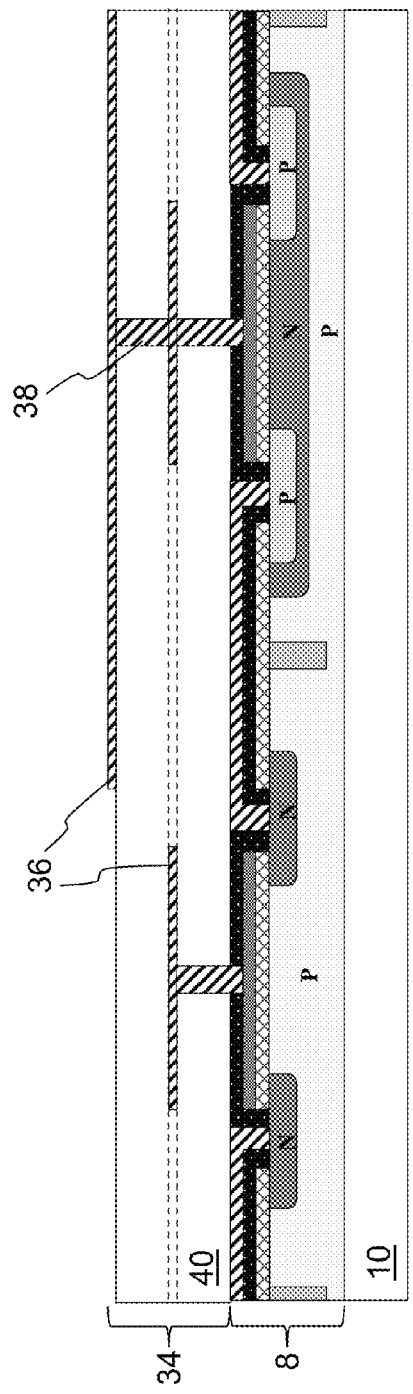

Using well known complementary metal-oxide-semiconductor (CMOS) fabrication processes, a routing layer 34 is formed over the processor 8. The routing layer 34 includes conductive traces 36 and vertical interconnects 38 extending on and/or through a dielectric substrate 40. Routing layer 34 provides electrical connections to the semiconductors and metallic structures (e.g. transistors, memory cells, busses, etc.) of the processor 8. Preferably, conductive traces 36 on the top of the routing layer are left exposed (which will be used for electrically connecting to the Analog-Digital-Converter (ADC) as described below). Each layer in the routing layer is preferably 0.5 µm or less in thickness. The resulting structure is shown in FIG. 3.

The ADC 42 is next formed starting with a silicon substrate 44 which is doped using a well-known silicon doping process such as diffusing doping, ion implantation or any other well know processes. A bonding interface material 46 is deposited on the bottom surface of the substrate 44, on the routing layer 34, or on both. The bonding interface material 46 is preferably an adhesive with dielectric properties such as a reaction-setting adhesive, a thermal-setting adhesive, or a wafer bonding agent of any other type that is well known in the art. The adhesive layer is preferably 0.5 µm or less in thickness. The ADC substrate 44 is then bonded onto the routing layer 34 via the bonding interface material 46.

Figure 4:
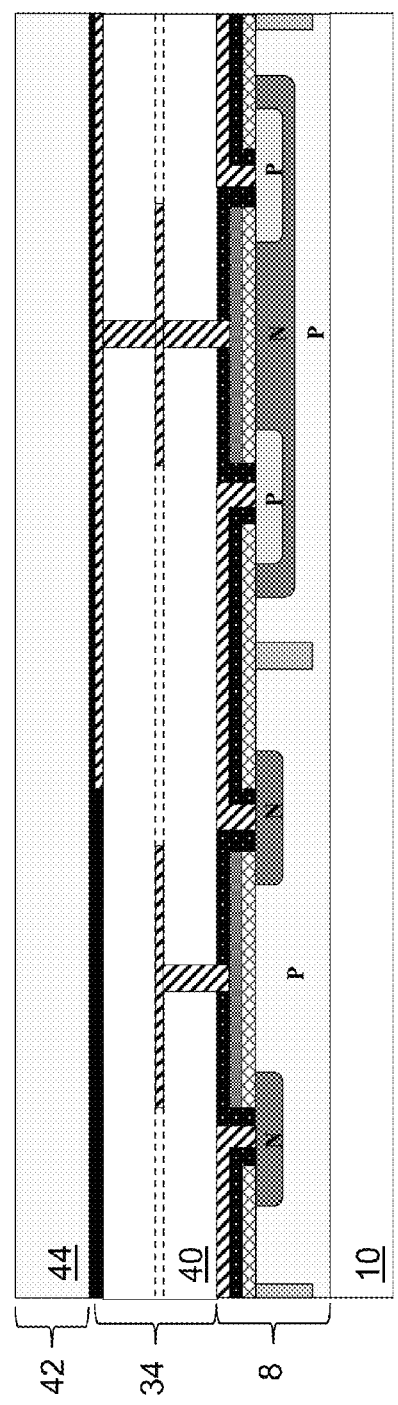

The silicon substrate 44 can be thinned using wafer thinning processes that are well known in the art. Techniques such as chemical mechanical polishing (CMP), plasma etching or any other technique can be used. Preferably, the thickness of substrate 44 less than 2 µm, such as approximately 0.5 µm. The resulting structure is shown in FIG. 4.

Figure 5:
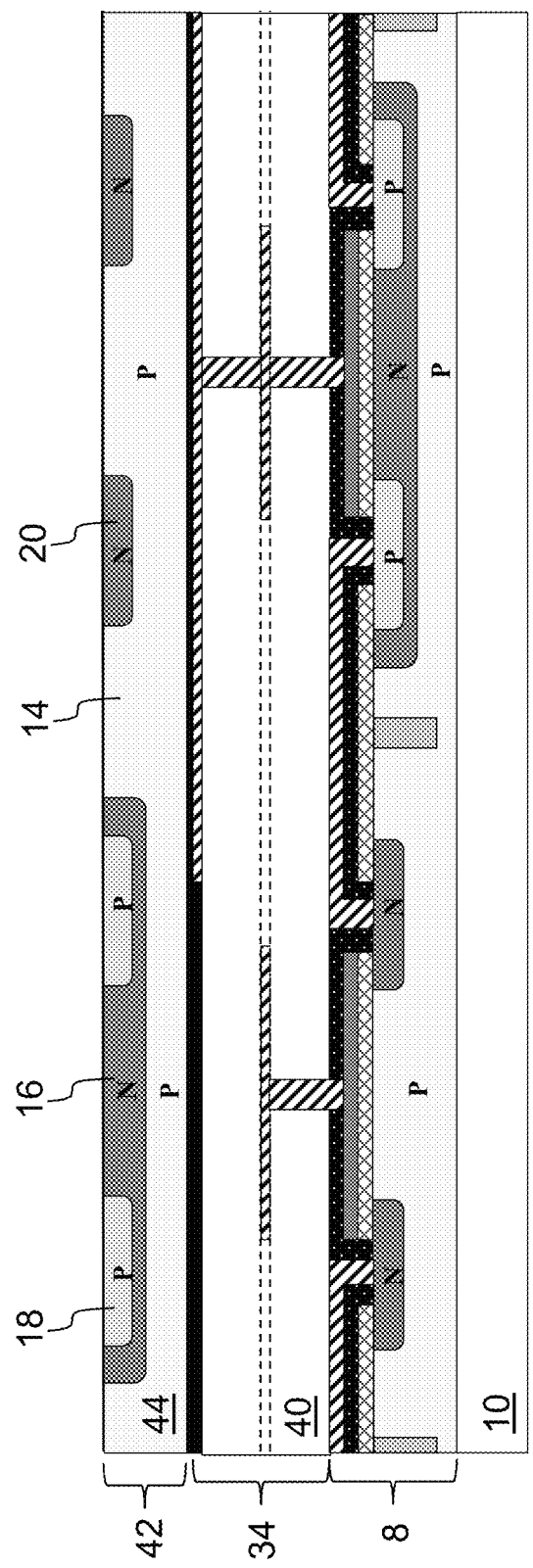

Additional impurities are selectively implanted into the already doped silicon substrate 44 to form ADC circuit elements and patterns such as isolation regions 12, well regions (e.g. P doped substrate or P wells 14, N wells 16, etc.), doped regions (e.g. P doped regions 18, N doped regions 20), P-N junctions, and other semiconductor patterns that are well known in the art for forming ADCs. While at least one layer of doping is used, doping can be repeated many times at various depths and areas, creating layers of doped silicon. Well known silicon doping processes such as diffusing doping, ion implantation and any other well know processes can be used. The doping pattern is shown in FIG. 5 and is exemplary only and intended as a generic representation of an ADC semiconductor device.

Figure 6:
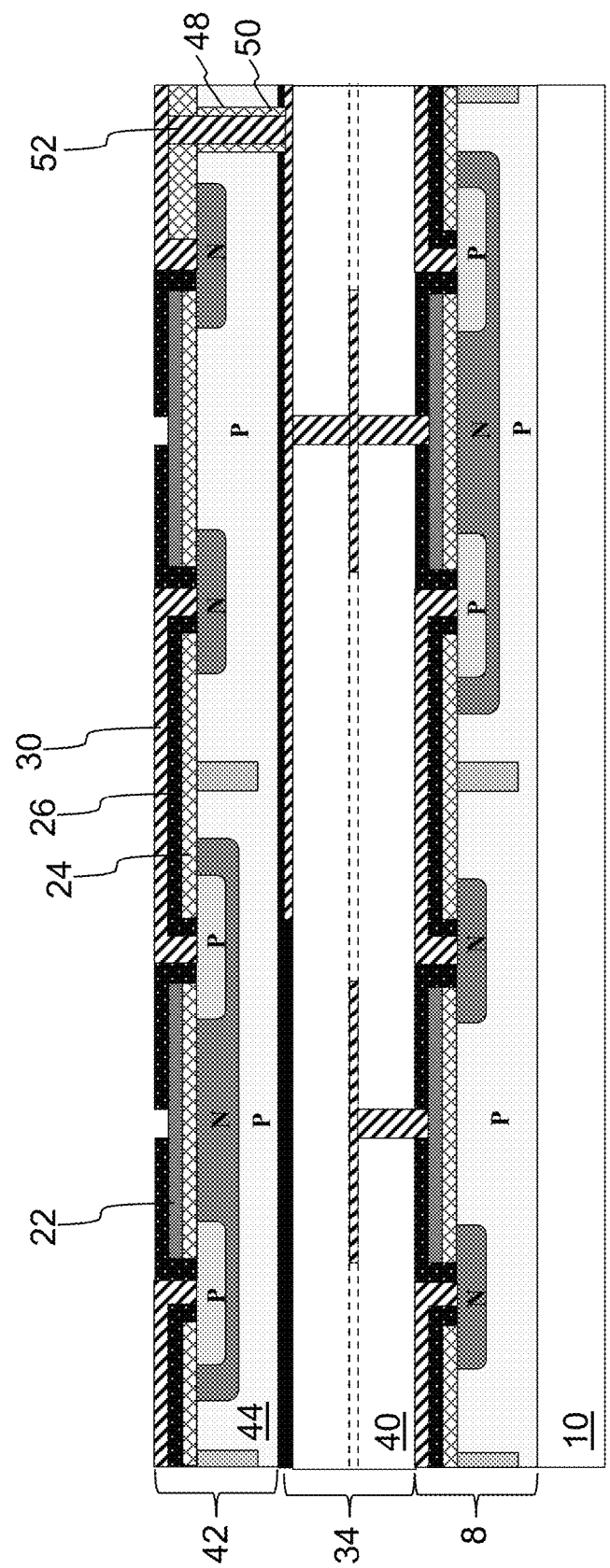

The ADC is completed by using well known complementary metal-oxide-semiconductor (CMOS) fabrication processes. Semiconductor structures, metallic layers and dielectric layers are formed over the silicon substrate (e.g. polysilicon layers 22, oxide layers 24, diffusion barriers 26, conductive traces 30, etc.) resulting in capacitors, amplifiers, analog to digital converters, busses, and any other components that are known to be included in a analog to digital processing. The ADC main task is to manage the photodiode, such as gathering, converting, transmitting, and amplifying the photodiode signal, or performing any other tasks compatible with CMOS image sensor photodiode analog devices. Each ADC will be connected to at least 1 photodiode and a readout circuit. The structure shown in FIG. 6 is exemplary only, and intended as a generic representation of ADC formation and structure. Vertical holes 48 are formed through the ADC substrate 44 by, for example, chemical etching or laser application. An insulation layer 50 (e.g. oxide) is formed on the walls of the holes 48. The holes 48 are then filled or lined with a conductive material 52, where the conductive material 52 forms vertical conductive interconnects for electrically connecting the ADC 42 and routing layer 34 (e.g. connecting selected conductive traces of each), and where the routing layer 34 in turn is connected to the processor 8. The resulting structure is shown in FIG. 6.

Figure 7:
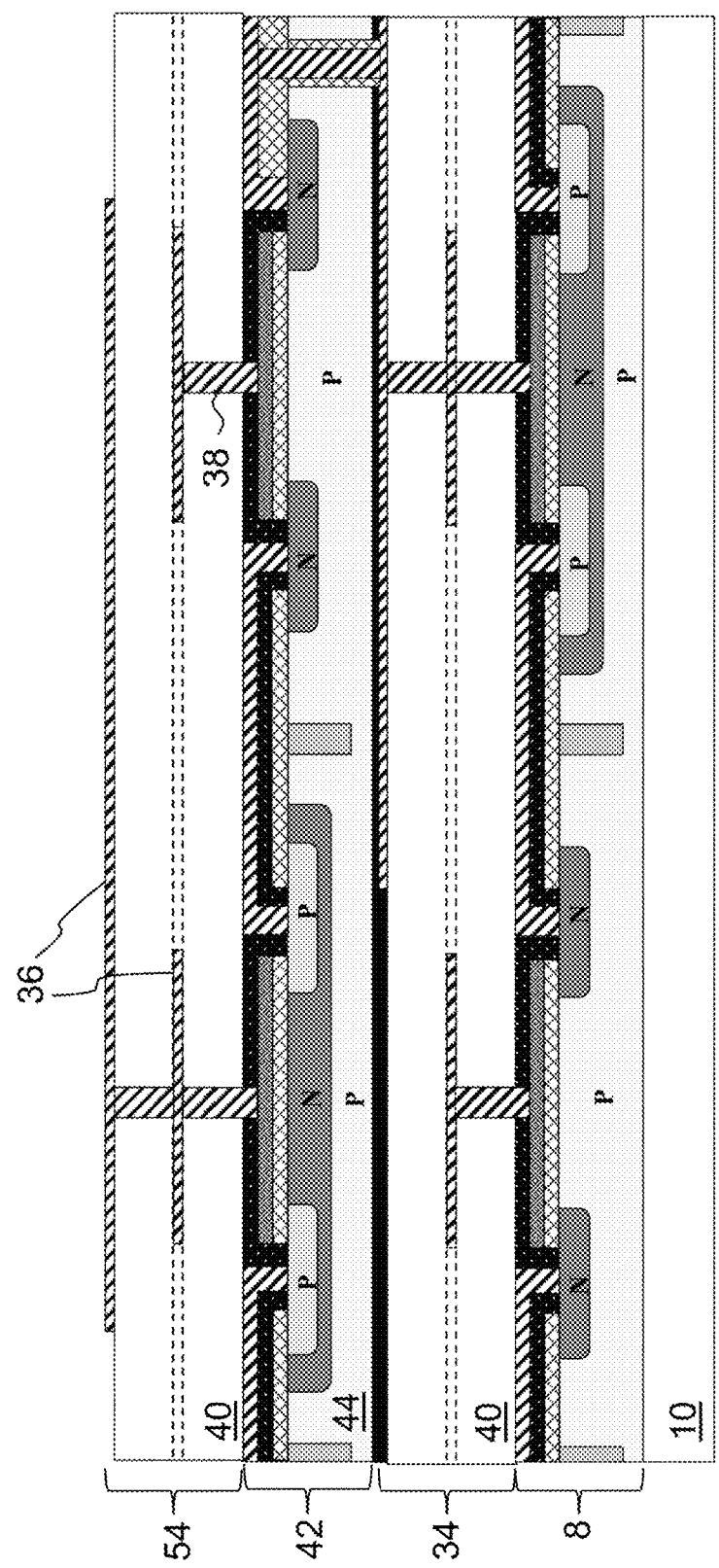

A second routing layer 54 (of similar design as routing layer 34 previously described) is mounted to the top of ADC 42 (making electrical contact with the elements of ADC 42), as shown in FIG. 7.

Figure 8:
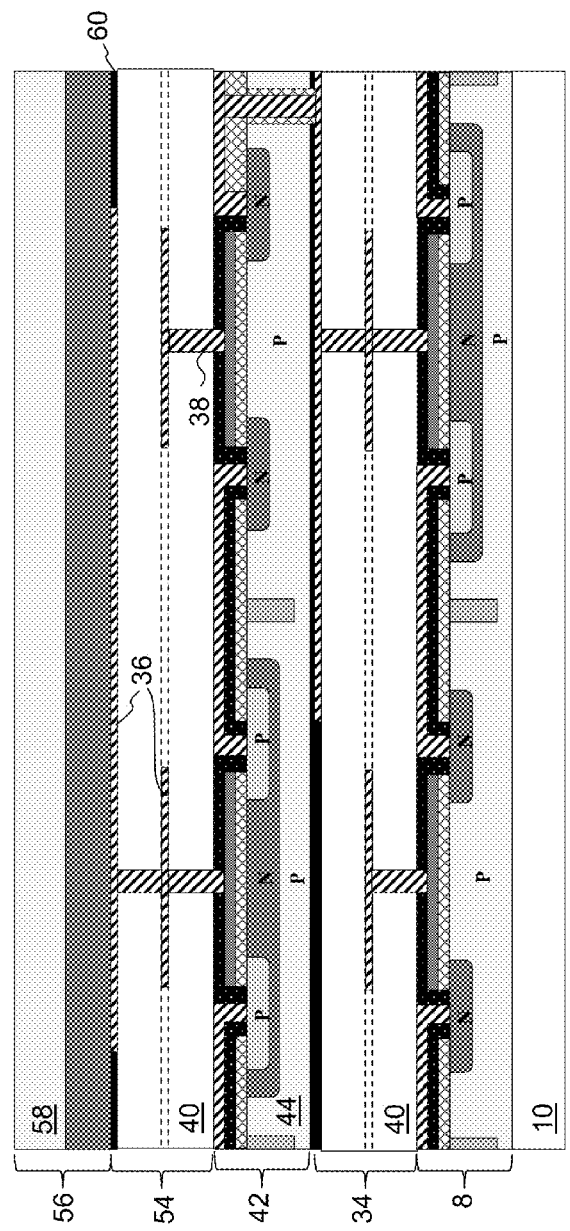

A photo detector 56 is then mounted over routing layer 54. The formation of photo detector 56 starts with a silicon wafer substrate 58 that is doped using a well-known silicon doping process such as diffusing doping, ion implantation or any other well-known processes to form a photo detector 56 (also referred to as a photo diode) that generates an electrical signal in response to incoming light. Such photo detectors are well known in the art and not further described herein. A bonding interface material 60 is deposited over the bottom surface of the doped silicon substrate 58. The bonding interface 60 can be a mix of material layers, and preferably is electrically conductive and acts as a bonding agent. Bonding agents such as conductive adhesives can be used, or a metallic material preferably with a melting temperature below 400 degrees Celsius can be used. Techniques such as cold welding, thermal compression bonding, metal to metal bonding or room temperature bonding can also be used, or any other wafer bonding techniques and materials can be used so that photo detector 56 is electrically coupled to the routing layer 54. For example, the trace layer 36 exposed on the top surface of the routing layer 54 can be coated with gold, and the photodiode doped silicon substrate 58 can be coated with a layer of indium. When the two interfaces are pressed together, the indium fuses into the gold to create an indium gold alloy. Thermal compression and annealing can be used to assist the process. The structure has silicon on both top and bottom surfaces. Both silicon surfaces can be thinned as necessary or appropriate. The silicon is thinned using wafer thinning processes that are well known in the art, such as Chemical Mechanical Polishing (CMP), plasma etching, etc. The thickness of the photodiode silicon substrate 58 is preferably less than 3 µm. The bottom side of the processor silicon substrate 10 is preferably thinned so that the entire structure is less than 200 µm in thickness, such as around 100 µm. The resulting structure is shown in FIG. 8.

Figure 9:
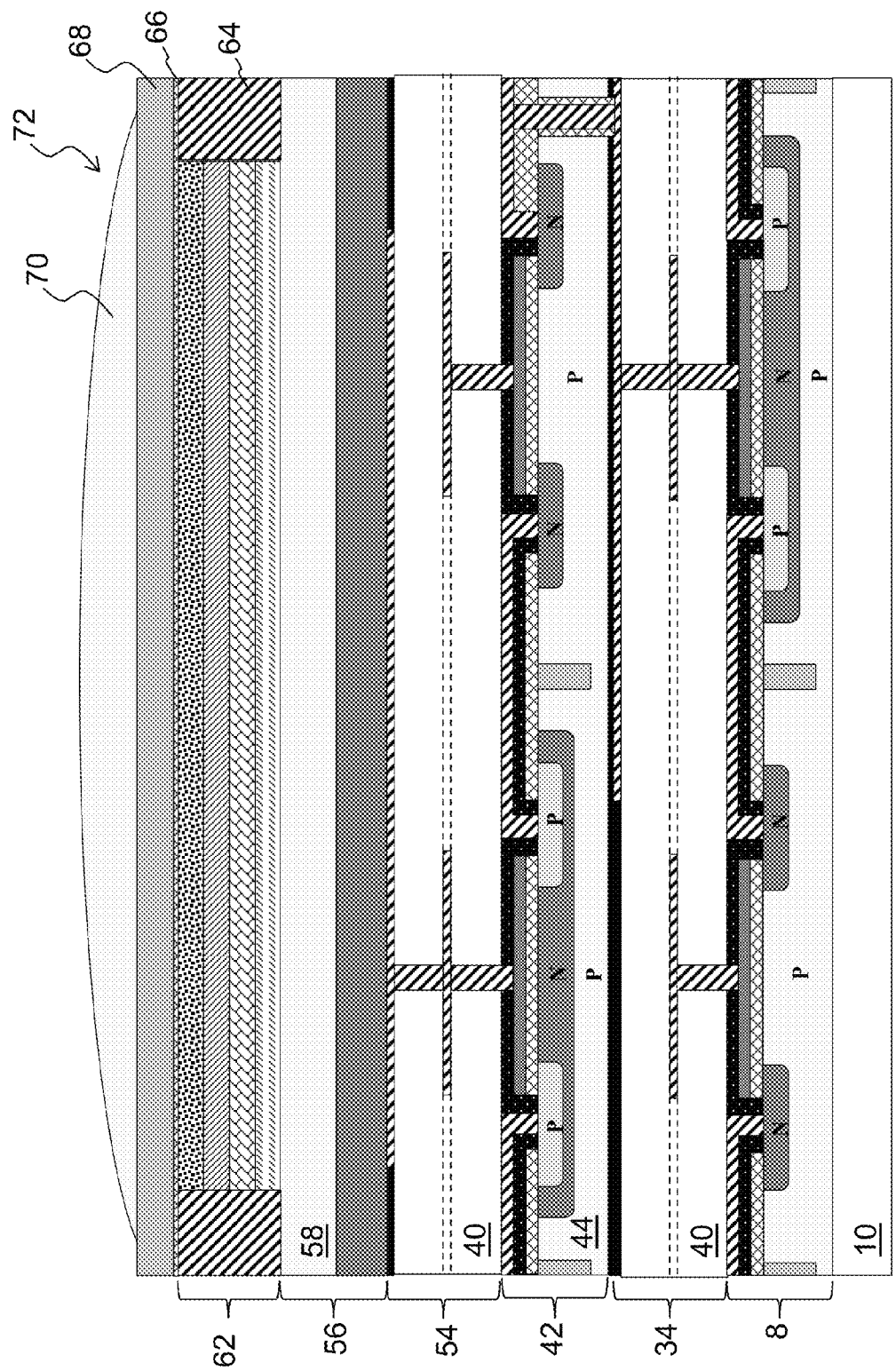

The photo detector assembly can include an optional optical enhancement layer 62 over the top surface of the photodiode 56, which can be anti-reflective or include quantum dots. One exemplary antireflection layer can include a Bottom Anti-Reflective Coating (BARC), a silicon nitride layer, a silicon oxide layer, and/or any other optical enhancement material that is well known in the art. An optional light shielding material can be formed in the optical enhancement layer 62 between adjacent photodiodes. For example, trenches can be formed through the optical enhancement layers and filled with the light shielding material 64. The light shielding material can be formed through the optical enhancement layer 62 as shown, and/or through the photodiode 56. In the latter case, the light shielding material can be formed before the optical enhancement layers. The purpose of light shielding material is to prevent cross talk between adjacent pixels. An optional oxide layer 66 can be deposited through physical vapor deposition onto the optical enhancement layer 62 (for improving bonding quality of color filter array (CFA) discussed below). A color filter 68 (or any other desirable optical layer(s) that are well known in the art) can be deposited on the oxide layer 66. Finally, an optional microlens 70 can be formed over the color filter 68 to improve the light gathering capability of the photo detector 56. The resulting photo detector assembly 72 is shown in FIG. 9.

Figure 10:
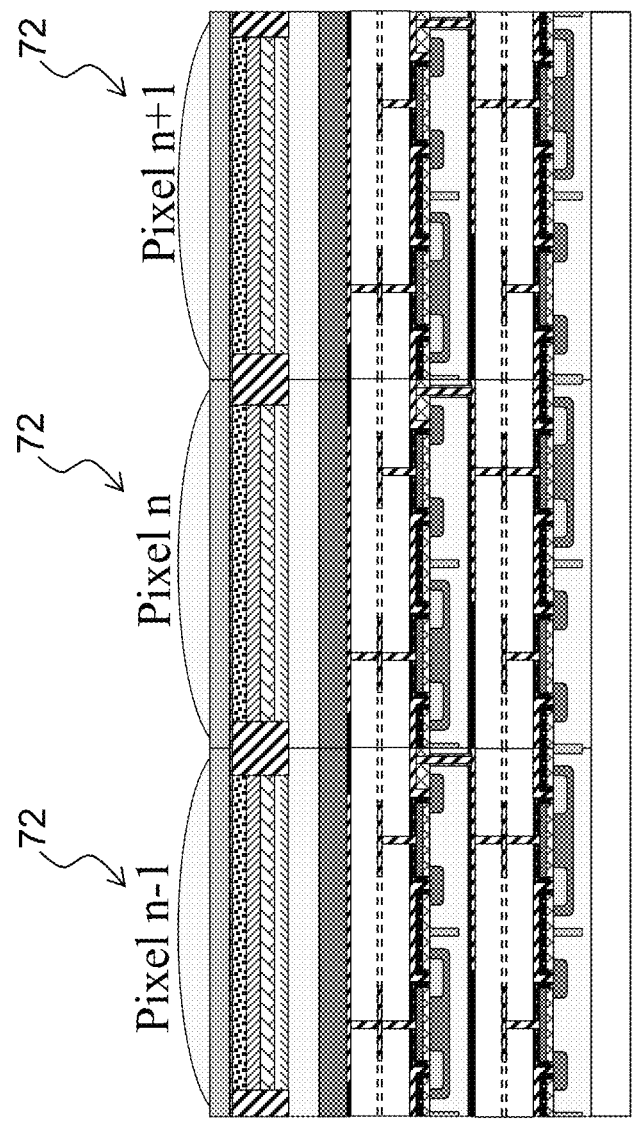
FIG. 10 is a side cross sectional view showing photo detector assemblies fabricated side by side.
Figure 11:
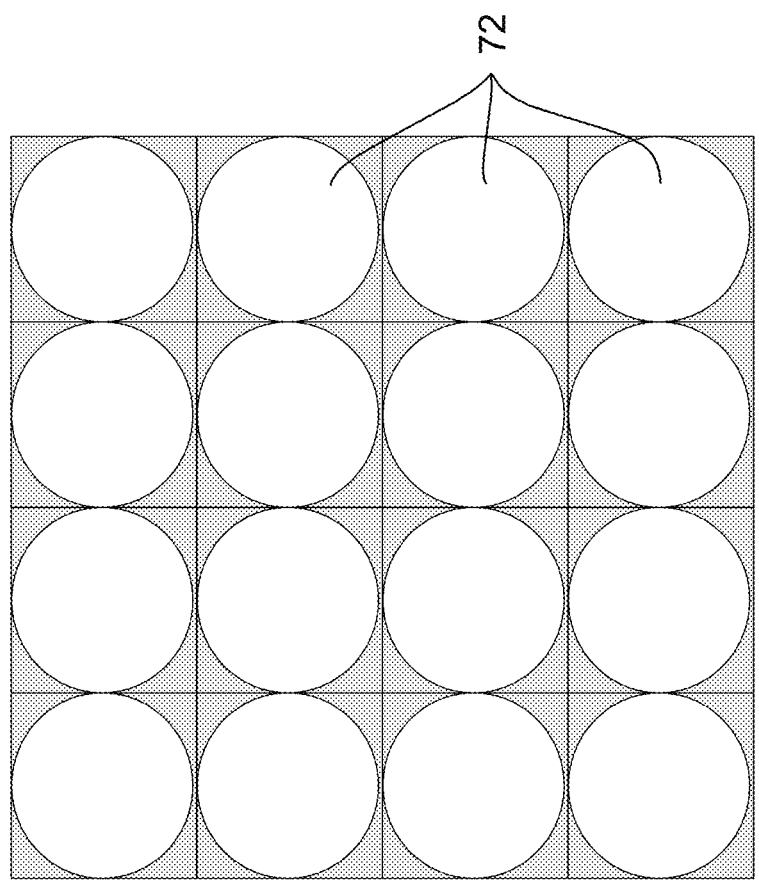
FIG. 11 is a top view of a 4×4 array of the photo detector assemblies.

The photo detector assembly 72 described above is best fabricated as a plurality of such assemblies arranged in an array on the same substrates, as illustrated in FIG. 10 (i.e. three photo detector assemblies 72 are shown, but many more are preferable as there can be as many image sensors 72 as there are as the number of pixels in the final image sensor). FIG. 11 shows a top view of 16 photo detector assemblies 72 arranged in a 4×4 array. The lateral sizes of the photo detector assemblies 72 can all be the same size as shown, or they can be vary as a function of distance from the center of the array (i.e. the photo detector assemblies 72 at the center of the array have the smallest lateral size, and the lateral sizes of the photo detector assemblies 72 can gradually increase as a function of position away from the center of the array. Preferably, the signals from the processors for the photo detector assemblies on the interior of the array are electrically coupled out through routing layer 34.

Figure 12:
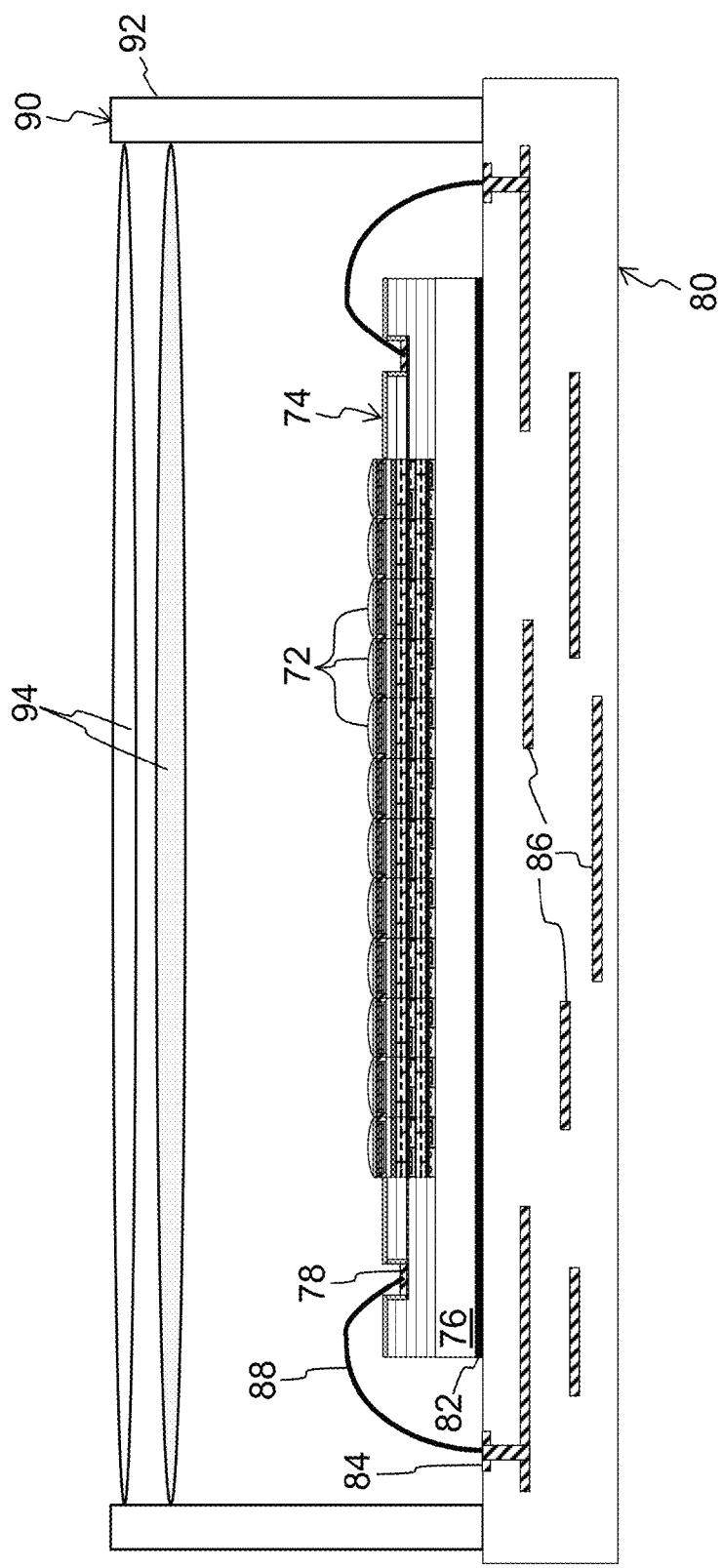
FIG. 12 is a side cross sectional view of the image sensor chip mounted to a circuit board.

An image sensor chip 74 includes an active area defined by a plurality of the photo detector assemblies 72 mounted to a substrate 76, along with bond pads 78 which are electrically coupled to the photo detectors assemblies 72. The image sensor chip 74 can be mounted to a rigid or flex circuit board 80 using a bonding interface 82 (e.g. epoxy, die attach tape, other types of bonding agents that are well known in the art, etc.). The bonding interface 82 can be either deposited on the backside of the image sensor chip 74 or on the rigid/flex circuit board 80. The circuit board 80 includes bond pads 84 connected to electrical routing 86 (e.g. conductive traces). Wire bonds 88 electrically connect the bond pads 78 of sensor chip 74 to the bond pads 84 of circuit board 80. An optional lens barrel 90 (which includes a housing 92 and one or more lenses 94) can be attached to circuit board 80 (and over the image sensor chip 74), as shown in FIG. 12.

Figure 13:
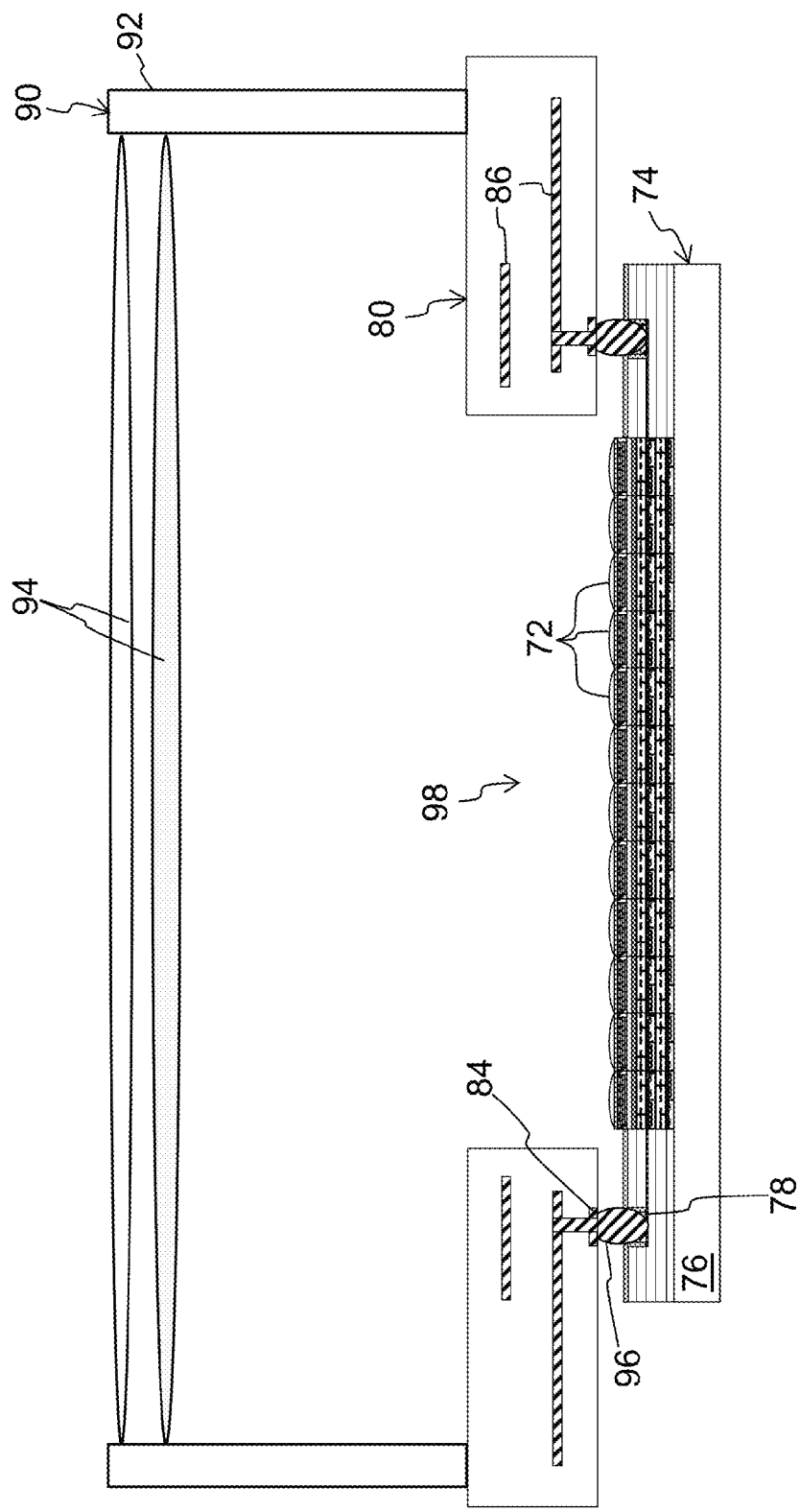
FIG. 13 is a side cross sectional view of the image sensor chip mounted to a circuit board in a flip chip configuration.

The image sensor chip can alternately be attached to the rigid/flex circuit board 80 in a flip chip configuration (i.e. using interconnects 96 to connect the bond pads 78 of the sensor chip 74 to the bond pads 84 of the circuit board 80), as illustrated in FIG. 13. The interconnects 96 can be gold studs, copper pillars, conductive bumps or any other well-known flip chip interconnect configuration. A window (i.e. aperture) 98 in the rigid/flex circuit board 80 exposes the image sensor chip's active area.

The present invention utilizes self-contained photo detector assemblies, each with its own processor, ADC and photo detector, using complementary metal-oxide-semiconductor (CMOS) processing methods, to improve sensory processing capabilities, improve processing power, reduce power consumption, reduce signal latency and reduce image system size. The structure integrates the digital processing capability into the image sensor chip. The structure and semiconductor devices in photo detector assemblies are fabricated layer by layer as a single integrated device. The thickness of proposed design is much thinner than existing devices fabricated separately and later combined, resulting in an overall size of 200 µm or less. The interconnection between layers can be less than 1 µm.

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed, but rather in any order that allows the proper formation of the image sensor of the present invention. Lastly, single layers of material could be formed as multiple layers of such or similar materials, and vice versa.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements therebetween.

What is claimed is:

1. A method forming an image sensor, comprising:
   providing a first substrate;
   forming each of a plurality of photo detector assemblies disposed on or in the first substrate by:
      forming a photo detector on or in a second substrate, wherein the photo detector is configured to generate an analog signal in response to received light,
      forming a converter on or in a third substrate,
      forming a processor on or in a fourth substrate,
      electrically coupling the converter to the photo detector, wherein the converter includes circuitry for converting the analog signal to a digital signal, and
      electrically coupling the processor to the converter, wherein the processor includes circuitry for processing the digital signal,
   wherein the forming the converter and the electrically coupling of the processor to the converter includes:
      forming a first routing layer on the fourth substrate, wherein the first routing layer includes a fifth substrate with at least one conductive trace;
      bonding the third substrate onto the first routing layer,
      thinning the third substrate, and
      forming the circuitry for converting the analog signal to the digital signal in the third substrate after the bonding of the third substrate onto the first routing layer and the thinning of the third substrate.

2. The method of claim 1, wherein for each of the plurality of photo detector assemblies, the coupling of the converter to the photo detector includes forming a second routing layer between the second and third substrates, wherein the second routing layer comprises:
   a sixth substrate disposed between the second and third substrates, and
   at least one conductive trace in the sixth substrate configured to convey the analog signal from the photo detector to the converter.

3. The method of claim 1, further comprising:
   forming an anti-reflective coating, a color filter and a lens over each of the photo detectors of the plurality of photo detector assemblies.

4. The method of claim 1, wherein the fourth substrates of all the plurality of photo detector assemblies are integrally formed as a single common substrate, and the second substrates of all the plurality of photo detector assemblies are separate substrates.

5. The method of claim 1, further comprising:
   forming bond pads on the first substrate that are electrically connected to the plurality of photo detector assemblies;
   mounting a circuit board to the first substrate, wherein the circuit board comprises:
      electrical traces, and
      bond pads electrically coupled to the electrical traces;
   electrically coupling each of the bond pads of the first substrate with one of the bond pads of the circuit board with wire bonds.

6. The method of claim 1, further comprising:
   forming bond pads on the first substrate that are electrically connected to the plurality of photo detector assemblies;
   mounting a circuit board to the first substrate, wherein the circuit board comprises:
      electrical traces, and
      bond pads electrically coupled to the electrical traces;
   electrically coupling each of the bond pads of the first substrate with one of the bond pads of the circuit board with electrical interconnects.

7. The method of claim 6, wherein the circuit board includes an aperture and wherein the photo detector assemblies are positioned to receive light passing through the aperture.

* * * * *